United States Patent [19]
Noguchi

[11] Patent Number: 5,334,916
[45] Date of Patent: Aug. 2, 1994

[54] APPARATUS AND METHOD FOR LED EMISSION SPECTRUM CONTROL

[75] Inventor: Masahiro Noguchi, Ibaraki, Japan

[73] Assignee: Mitsubishi Kasei Corporation, Tokyo, Japan

[21] Appl. No.: 888,758

[22] Filed: May 27, 1992

[30] Foreign Application Priority Data

May 27, 1991 [JP] Japan .................................. 3-121317

[51] Int. Cl.⁵ .......................... G05F 1/00; H05B 41/36
[52] U.S. Cl. .................................................... 315/309
[58] Field of Search ................................ 315/291, 309

[56] References Cited
U.S. PATENT DOCUMENTS
4,529,949 7/1985 deWit et al. ........................ 330/289

Primary Examiner—Tony M. Argenbright
Attorney, Agent, or Firm—Armstrong, Westerman, Hattori, McLeland & Naughton

[57] ABSTRACT

An emission spectrum controlling apparatus and method for an LED are disclosed. A temperature measurement device is provided for measuring the temperature of a light emitting diode or the temperature in the surrounding environment of the light emitting diode. A driving power control device is also provided for controlling the driving power of the LED, and a computing unit is disclosed which controls the driving power control device based on the temperature information from the temperature measuring device and the driving power information from the driving power control device.

8 Claims, 3 Drawing Sheets

APPARATUS AND METHOD FOR LED EMISSION SPECTRUM CONTROL

BACKGROUND OF THE INVENTION

1. Field of the Invention

The present invention relates to an apparatus and method for controlling the emission spectrum of an LED with high precision, and can be utilized in connection with an emission element (LED) standard light source, an LED light source for a sensor, optical communication equipment, etc.

2. Description of the Related Art

It is known in theory that an emission spectrum of an LED changes along with ambient temperature or a driving current. When an LED standard light source is manufactured which emits light of a particular spectrum, for example, based on the knowledge in theory of changes of emission spectrum of an LED, the LED is set in a thermostatic chamber and the temperature of the LED is kept at a specified value in monitoring the emission spectrum.

SUMMARY OF THE INVENTION

An emission spectrum could be quantitatively and precisely monitored by using a spectrometer type measuring system for monitoring the emission spectrum, the system incorporating large and expensive devices such that the system as a whole is expensive and difficult to handle.

One object of the present invention is to improve the above-noted problems of expense and size.

Another object of the present invention is to provide an emission spectrum control apparatus and method which is small sized, easy to handle, has a simplified form, and which also has a low manufacturing cost by, for example, developing integrated circuitry.

In accordance with the above-noted objects, an emission spectrum control apparatus and method is provided comprising a temperature measurement means for measuring the temperature of an LED or for measuring the temperature in the environment in which the LED is disposed, a driving power control means for controlling the driving power of the LED, and a computing unit which controls the driving power control means based on temperature information from the temperature measurement means and driving power information from the driving power control means. A plurality of LEDs and a plurality of temperature measurement means can be utilized in the present invention.

BRIEF DESCRIPTION OF THE DRAWINGS

The present invention will be further explained in connection with the accompanying drawings wherein.

DESCRIPTION OF THE PREFERRED EMBODIMENTS

In the present invention, an emission wavelength varies according to an optical band gap at a standard temperature, driving power and difference between the temperature of an LED or the surrounding ambient temperature and the standard temperature. The temperature of the LED itself or the surrounding ambient temperature and the driving power of the LED are detected. Then, the emission wavelength energy can be calculated by subtracting the value of an applied power multiple by a specified coefficient and the difference from the standard temperature multiple by a specified coefficient from the optical band gap at the standard temperature. The emission wavelength can be controlled by controlling the driving power of the LED based on the output of the computing unit.

Figure 1:
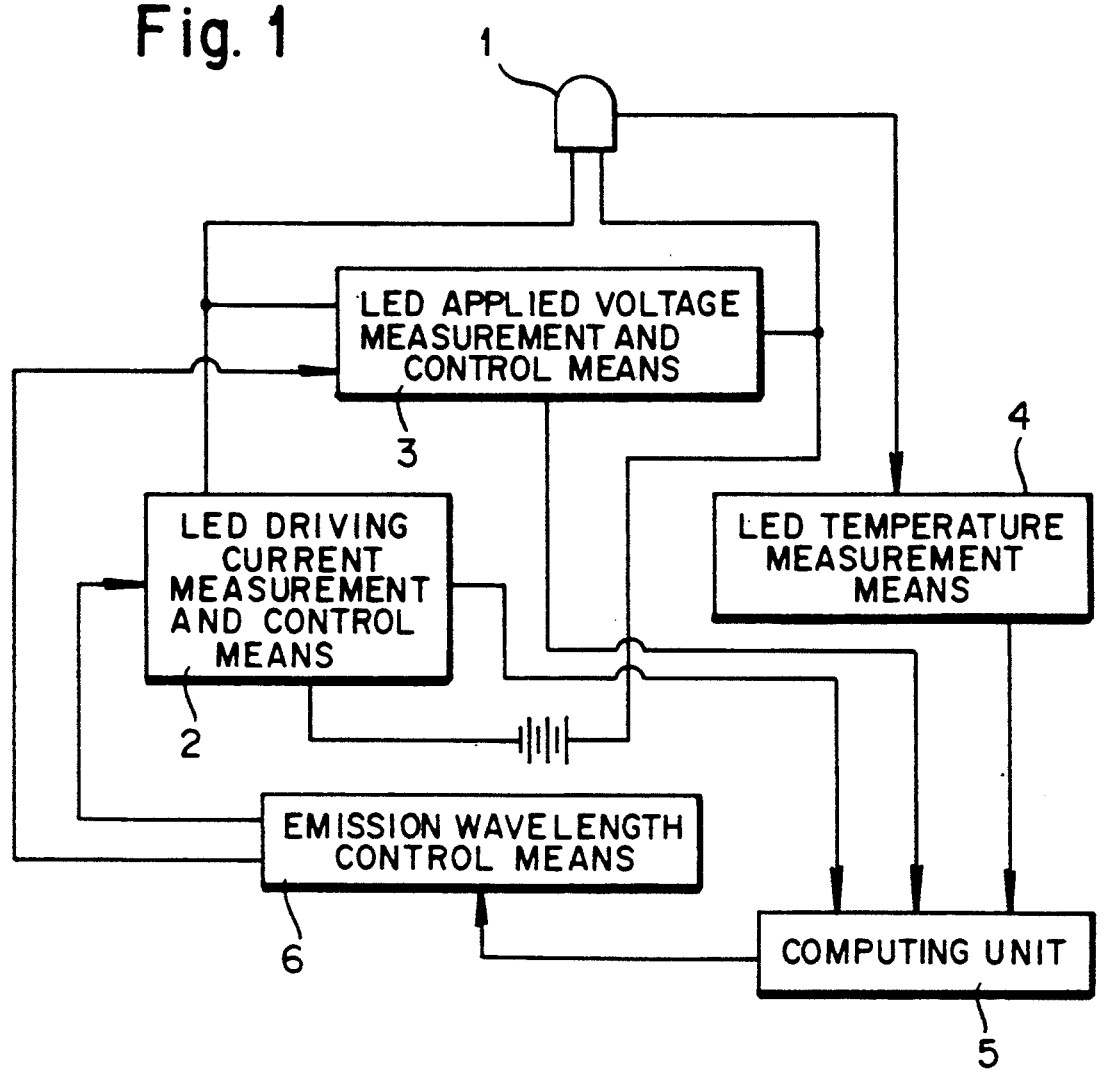
FIG. 1 is a block diagram showing the system for LED emission spectrum control.

In FIG. 1, 1 is an LED with a sensor for measuring temperature, 2 is a measurement and control means for an LED driving current, 3 is a measurement and control means for an LED applied voltage, 4 is a measurement means for an LED temperature, 5 is a computing unit, and 6 is a control means for an emission wavelength.

The temperature of the LED is measured by a temperature sensor. However, the temperature to be measured is not limited to the temperature of the LED itself, but the temperature in the environment surrounding the LED can also be measured. The sensor to be used can be either a contact-type or a non contact-type sensor. The desirable range in which the sensor is to be disposed is within a radius of 300 mm from a radiating LED, if a contact-type sensor is used, and within 15 mm is a non contact-type sensor is used.

The number of LEDs or sensors used in the present invention can be more than one each. If the shortest distance among the various positions of sensors and LEDs is within the range of 300 mm (or 15 mm for noncontact sensors), the arrangement will be suitable for achieving good results in the present invention. A thermocouple or a platinum resistor, as examples, can be used as the contact-type sensor in the present invention, and an infrared ray detector or a thermopile, as examples, can be used as the noncontact-type sensor in the present invention.

Figure 2:
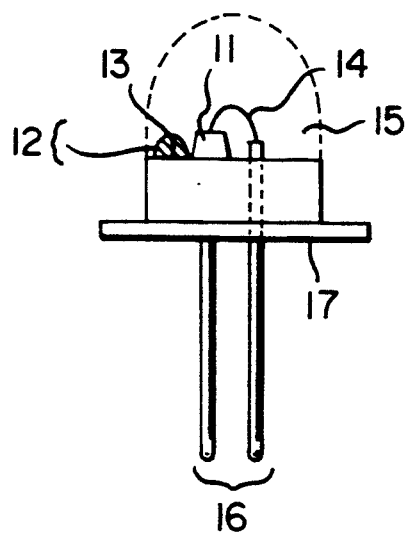
FIG. 2 illustrates an embodiment of the present invention having an LED with a thermocouple.

In FIG. 2, 11 is an LED, 12 is a C-A thermocouple, 13 is an epoxy adhesive, 14 is a Au wire, 15 is a transparent coating resin, 16 is a terminal pin and 17 is a two pin header. In the embodiment illustrated in FIG. 2, LED 11 is bonded to a can type header 17, and the C-A thermocouple 12 is fixed with an epoxy adhesive 13 (e.g. "Araldite"). The LED and terminal pin 16 are connected with a Au wire 14, and this arrangement is coated with the transparent coating resin 15.

In operation, a temperature signal detected by LED lamp 11 is converted to a digital signal by the LED temperature measurement means 4 having a voltmeter and an A/D converter. The temperature information is input to computing unit 5 along with information from the measurement and control means for the LED driving current 2 and the measurement and control means for the LED applied voltage 3.

In the computing unit 5, a computing operation is performed in order to determine the emission wavelength energy based on the equation:

$$EWE = OB - \alpha \times AP - \beta \times DST, \quad (1)$$

wherein EWE is the emission wavelength energy, OB is the optical band gap at a standard temperature, AP is the applied power, and DST is the difference from a standard temperature.

The standard temperature from equation (1) can be an arbitrary temperature predetermined in advance, and the coefficients $\alpha$ and $\beta$ are values to be obtained experimentally based on the particular material, shape, etc. constituting the LED. The optical band gap of a material is decreased by the heat generated by the driving power or a temperature rise. Since the wavelength energy (a reciprocal of an emission wavelength) changes along with the change of the optical band gap, the values of the coefficients $\alpha$ and $\beta$ are found experimentally, and the emission wavelength is obtained from equation (1). Thus, the emission wavelength spectrum can be controlled by controlling the driving power of the LED.

Based on the calculation result from equation (1) in the computing unit, the difference between the calculation result and a desired wavelength is found in the emission wavelength control means 6. The emission wavelength is controlled based on equation (1) by controlling the current measurement and control means 2 and/or voltage measurement and control means 3. The power control for an LED can be performed by controlling current or voltage individually or both simultaneously. Thus, a desired emission wavelength spectrum can be obtained from the LED.

Figure 3:
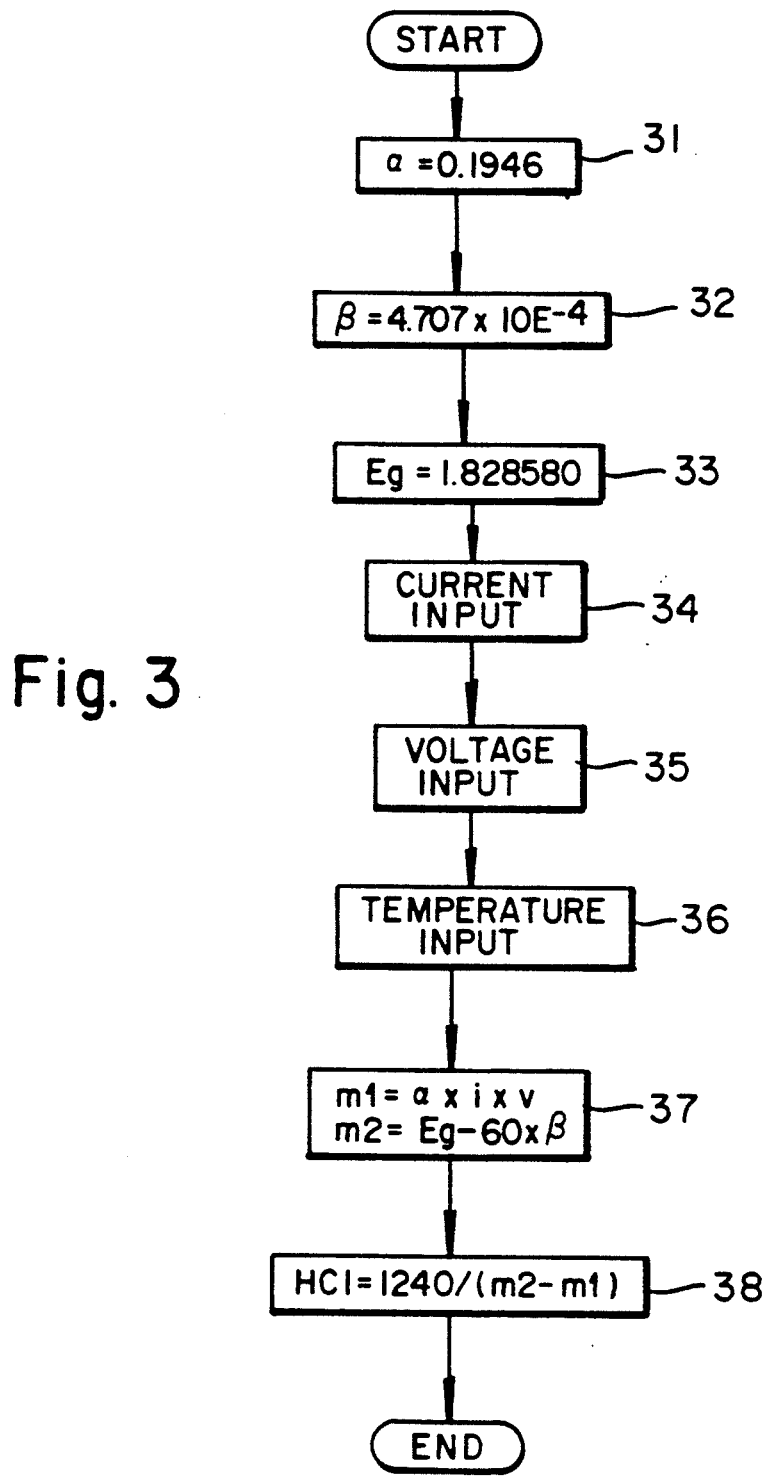
FIG. 3 is a flow chart for illustrating the system for calculating an emission wavelength.

FIG. 3 illustrates the emission wavelength calculation process of the present invention. As can be seen in FIG. 3, $\alpha = 0.1946$ and $\beta = 4.707 \times 10^{-4}$ and an optical gap EG, at a standard temperature $= 1.828580$ eV (steps 31 to 33). Then, 0.03 A, 1.86 V and 60° C. are substituted for a current i, a voltage v, and a temperature T, respectively (steps 34–36). In step 37, $m1 = \alpha \times i \times v$, and $m2 = EG - 60 \times \beta$ are determined. In step 38, a present emission wavelength HC1 is obtained where $HC1 = 1240/(m2-m1)$. It should be noted that $m2 - m1$ corresponds to the right side of equation (1), the reciprocal of which is the emission wavelength (1240 in step 38 is a constant).

Figure 4:
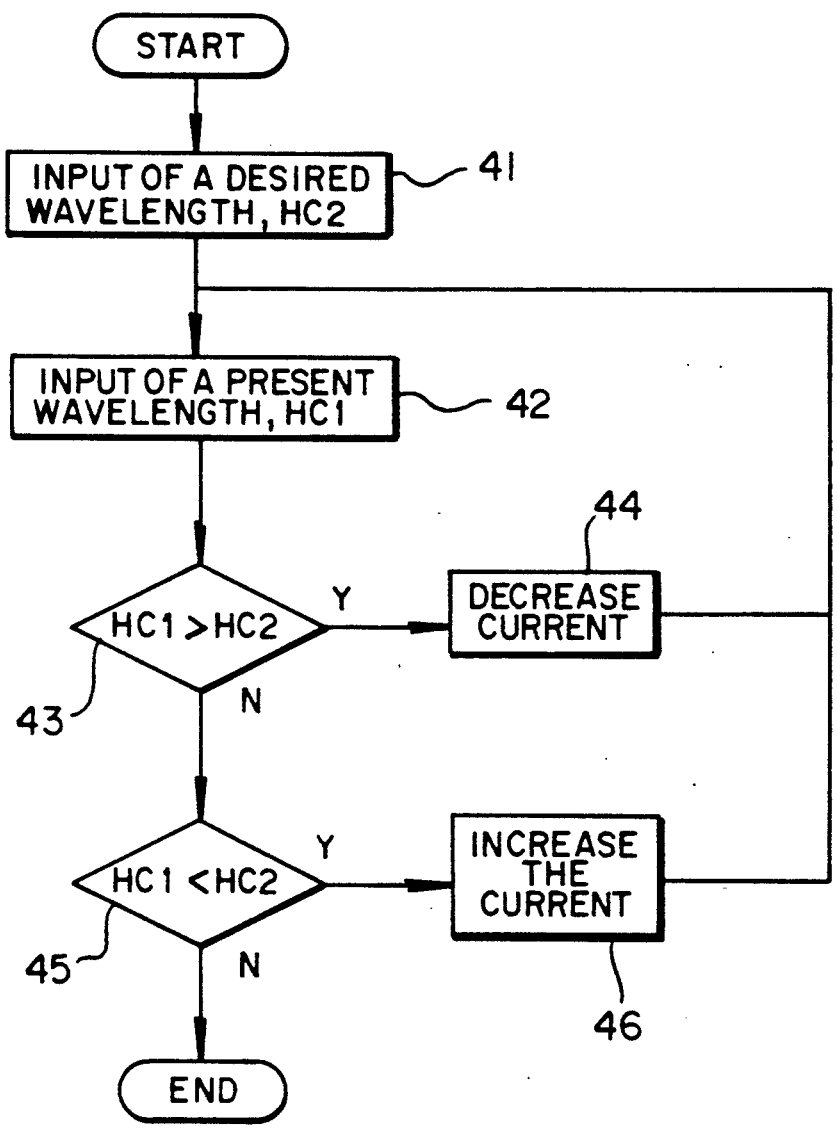
FIG. 4 is a flow chart illustrating the process for controlling the emission wavelength.

As shown in FIG. 4, in the emission wavelength control process of the present invention, a desired wavelength HC2 is at first input and then the present wavelength HC1 is input (steps 41 and 42). Then, HC1 and HC2 are compared. If HC1 is larger than HC2 (step 43), the current is decreased (step 44), and if HC1 is smaller than HC2 (step 45), the current is increased (step 46). Thus, the emission wavelength can be controlled to be HC2.

1. At 273 K,
when i=10 mA, v=1.720 V and the central frequency, HC, =679.2 nm are detected, and when i=20 mA, v=1.825 V and the central frequency, HC, =680.6 nm are detected, and these data are substituted in equation (1), a value for $\alpha$ of 0.1945336 is obtained.

2. At 293 K,
when i=10 mA, v=1.690 v and the central frequency, HC=682.7 nm are detected, and when i=20 mA, v=1.800 V and the central frequency, HC,=684.1 nm are detected, and these data are substituted in equation (1), a value for $\alpha$ of 0.1945654 is obtained. Therefore, it can be seen that $\alpha$ is a constant independent of temperature, the value being approximately 0.2. When the equation (1) is solved for $\beta$ under the conditions 1 and 2 above, $\beta = 4.707 \times 10^{-4}$.

In equation (1), when the standard temperature, Td, =273 K, Eg=1.828580, the temperature, Ti, =333 K (60° C.), and the current i flowing through the LED=30 mA, the voltage, v, =1.86 V is obtained using the values, $\alpha = 0.2$, and $\beta = 4.707 \times 10^{-4}$. When HC is obtained by an operation process using these data, the emission wavelength, HC, is found to be 692.888 nm. On the other hand, the measured value is 692.900 nm, and the error (difference between the emission wavelength energy obtained by an operation and the measured value) is as little as 0.03 meV.

As can be seen from the above, it is possible to control the emission wavelength of an LED by measuring the current and voltage of the LED, as well as measuring the temperature of the LED with a simple apparatus without actually measuring an emission spectrum using a large and/or expensive apparatus such as a spectrometer. Thus, according to the present invention, it is possible to control the emission spectrum of an LED at low cost such that the spectrum control of the present invention can be used with LED standard light sources, LED light sources for sensors, optical communication equipment, etc.

It will be understood by those skilled in the art that the above described features of the invention are illustrative and not limiting. Variations and modifications will be recognized by those skilled in the art as being within the scope of the present invention.

I claim:

1. An emission spectrum controlling apparatus for at least one light emitting diode comprising:

a temperature measurement means for measuring at least one of the temperature of a corresponding one of said at least one light emitting diode and the temperature in an environment proximate to a corresponding one of said at least one light emitting diode;

a driving power control means for controlling the driving power of the at least one light emitting diode;

a computing means for computing an emission wavelength of the at least one light emitting diode; and emission wavelength control means for controlling the driving power control means based on the temperature information from the temperature measurement means and driving power information from the driving power controlling means.

2. An emission spectrum controlling apparatus as in claim 1, wherein said at least one light emitting diode comprises a plurality of light emitting diodes, and said at least one temperature measurement means comprises a plurality of temperature measurement means.

3. An emission spectrum controlling apparatus as in claim 1, wherein said driving power control means comprises at least one of a current measurement and control means and a voltage measurement and control means.

4. An emission spectrum controlling apparatus as in claim 3, wherein said emission wavelength control means comprises a means for comparing the computed emission wavelength from the computing unit with a desired emission wavelength, and controlling at least one of said current measurement and control means and said voltage measurement and control means to arrive at said desired emission wavelength of said at least one light emitting diode.

5. An emission spectrum controlling method for controlling the emission spectrum of at least one light emitting diode comprising:

measuring at least one of the temperature of said at least one light emitting diode and the temperature in an environment proximate to said at least one light emitting diode with a temperature measurement means;
controlling the driving power of the at least one light emitting diode with a driving power control means;
computing an emission wavelength of the at least one light emitting diode based on the temperature information from the temperature measurement means and driving power information from the driving power control means; and
controlling the driving power control means based on the computed emission wavelength.

6. An emission spectrum controlling method as in claim 5, wherein said at least one light emitting diode comprises a plurality of light emitting diodes, and said at least one temperature measurement means comprises a plurality of temperature measurement means.

7. An emission spectrum controlling method as in claim 5, wherein controlling the driving power comprises controlling at least one of current and voltage.

8. An emission spectrum controlling method as in claim 7, further comprising comparing the computed emission wavelength with a desired emission wavelength and controlling at least one of current and voltage to said at least one light emitting element to achieve said desired emission wavelength.

* * * * *